United States Patent [19]
Jaffard et al.

[11] Patent Number: 5,189,685
[45] Date of Patent: Feb. 23, 1993

[54] FAST COUNTER/DIVIDER AND ITS USE IN A SWALLOWER COUNTER

[75] Inventors: Jean-Luc Jaffard, Saint Egreve; Loïc Lietar, Paris; Michel Mouret, Jarry, all of France

[73] Assignee: SGS-Thomson Microelectronics, S.A., Gentilly, France

[21] Appl. No.: 758,830

[22] Filed: Sep. 11, 1991

[30] Foreign Application Priority Data

Sep. 12, 1990 [FR] France .................. 90 11511

[51] Int. Cl.[5] .......................................... H03K 23/66
[52] U.S. Cl. ................................ 377/48; 377/47; 377/49
[58] Field of Search ........................ 377/47, 48, 49

[56] References Cited

U.S. PATENT DOCUMENTS

| | | | |
|---|---|---|---|
| 4,034,302 | 7/1977 | May | 377/48 |
| 4,084,082 | 4/1978 | Alfke | 377/47 |
| 4,587,664 | 5/1986 | Iida | 377/48 |
| 4,633,194 | 12/1986 | Kikuchi et al. | 377/47 |

FOREIGN PATENT DOCUMENTS

| | | |
|---|---|---|
| 245094 | 4/1987 | Fed. Rep. of Germany . |
| 58-83435 | 5/1983 | Japan . |
| 63-4717 | 1/1988 | Japan . |
| 63-107318 | 5/1988 | Japan . |

Primary Examiner—John S. Heyman
Attorney, Agent, or Firm—Lowe, Price, LeBlanc & Becker

[57] ABSTRACT

A counter/divider dividing an input frequency (F1) by $2^{q+n}+\frac{1}{2}$, comprises a first divider by $2^q$ (30) receiving the signal to divide of a frequency F1 and provides $2^{q+1}$ outputs at the frequency $F1/2^q$ out of phase the ones to the others of $360°/2^{q+1}$; a multiplexer (32) having a control terminal (34) and sequentially providing at its output (33) each of said $2^{q+1}$ outputs each time a control signal is applied; and a second divider by $2^n$ (31) receiving the output (33) of the multiplexer and providing the desired output (34) of the counter/divider, this output being applied to the control terminal of the multiplexer.

4 Claims, 2 Drawing Sheets

FAST COUNTER/DIVIDER AND ITS USE IN A SWALLOWER COUNTER

BACKGROUND OF THE INVENTION

The present invention relates to a fast counter, and more particularly to a counter liable to count input pulses and to provide an output pulse each time an integer power of 2 of these pulses or integer power of 2 of these pulses plus half a pulse has been counted.

It will be noted that such a counter is particularly useful in constructing a programmable divider of the swallower counter type. However, the present invention has other applications which will appear to those skilled in the art.

A typical programmable divider of the swallower counter type is shown in FIG. 1.

In order to initially clarify the vocabulary, it will be noted that a counter up to a certain value N of which only the Nth counting value is extracted is equivalent to a divider by N. Indeed, it provides an output pulse every N input pulses. This is why the words divider and counter will be in certain cases indifferently used.

As it is shown in FIG. 1, a swallower counter comprises a divider 10 liable to divide by $2^m$ or by $2^m+1$ subject to the state of a control signal arriving at its input 11. The output of the counter 10 is sent in parallel to first and second counters 12, 13. Counter 12 counts pulses up to a value B and counter 13 counts pulses up to a value A greater than B. Counter 13 is connected to count cyclically, i.e. the counting starts from zero once the maximum value A is attained. Counter 12 stops counting when the maximum value B is attained, until it is reinitialized by the output signal of counter 13. The output of counter 12 is applied to the input 11 of divider 10. Counters 12 and 13 are generally intended to have their counting values B and A programmed by a control signal sent for example on a bus (not represented), in a conventional way.

A swallower counter of the type shown in FIG. 1 enables, as a function of the choice of the values A and B, to achieve a frequency division by any chosen value non multiple of 2. The input frequency applied to the divider 10 is designated F0 and the output frequency of counter 13 is designated F2. If it is desired to have F2=F0/k, one can write:

$$k = A2^m + B,$$

or $$k = (A-B)2^m + B(2^m+1).$$

The circuit of FIG. 1 does provide F2=F0/k. Indeed, if it is considered that counter 10 is initially conditioned to divide by $2^m+1$, a pulse will be obtained at the output of counter 10 every $2^m+1$ periods of F0 and counter 12 will provide an output at 11 when $B(2^m+1)$ pulses of F0 arrive. Then, counter 12 is inhibited and divider 10 divides by $2^m$. Counter 13 has already counted B pulses. When the next A−B pulses are obtained at the output of divider 10, a pulse is provided at the output of counter 13 and the desired division factor k is indeed obtained.

It will be noted that only divider 10 counts rapidly, counters 12 and 13 counting substantially at a frequency $2^m$ times smaller than this counter. In order to count pulses F0 following each other very rapidly, it is hence necessary to provide a fastest possible divider 10. If the operation of a counter or a divider is globally examined, it must achieve a sequence of logical operations between two successive transitions of a clock signal. The boolean arithmetic teaches that every complex logic operation such as counting can be decomposed in at most two levels of elementary logic operations corresponding to two switchings of a flip-flop. For a divider by a value other than an integer power of 2, an additional flip-flop switching time must be furthermore provided in order to store the output of the divider or an intermediate information in a latch. Thus, a conventional optimized counter, other than a divider by $2^q$, and especially a programmable divider, generally needs, between two pulses to count, sufficient time for three flip-flop switchings. In a given integrated circuit manufacturing technology, the elementary switching time of a flip-flop is predetermined and the maximum counting frequency hence encounters a fundamental limitation (which is for example of the order of 40 MHz in MOS technology, 2 micrometers, with a static type logic).

An object of the present invention is to provide a counter/divider other than by $2^q$ comprising no fundamental limitation corresponding to a plurality of the above mentioned flip-flop switching times, and more particularly such a counter whose operating speed limit is as fast as that of a divider by $2^q$.

Another object of the present invention is to provide such a counter/divider liable, as a function of a control signal, to achieve a division by an integer power of 2 or by a power of 2 plus half a unity and to pass from one division mode to the other without reducing the counting speed limit.

Another object of the present invention is to provide a fast counter/divider usable in a swallower counter circuit.

SUMMARY OF THE INVENTION

To achieve these objects as well as others, the present invention provides a counter/divider dividing an input frequency by $2^{q+n}+\frac{1}{2}$, comprising: a first divider by $2^q$ receiving the signal to divide of frequency F1 and providing $2^{q+1}$ outputs at the frequency $F1/2^q$ out of phase the ones to the others of $360°/2^{q+1}$; a multiplexer having a control terminal and sequentially providing at its output each of said $2^{q+1}$ outputs each time a control signal is applied to said terminal; and a second divider by $2^n$ receiving the output of the multiplexer and providing the desired output of the counter/divider, this output being applied to the control terminal.

According to an embodiment of the present invention, the output of the second divider is provided to the output terminal of the counter/divider through a latch sequenced by the signal applied to the second divider.

According to an embodiment of the present invention, the counter/divider comprises means to inhibit the operation of the multiplexer, whereby a same output of the first divider is permanently provided to the input of the second divider and whereby the division rate of the counter/divider is $2^{q+n}$.

According to an embodiment of the present invention, the multiplexer comprises a third divider by $2^{q+1}$ all the outputs of which are decoded by a decoder and applied to a latch, the outputs of which sequentially control $2^{q+1}$ switches respectively placed between each of the $2^{q+1}$ outputs of the first divider and the output of the multiplexer.

The present invention also concerns the use of a counter/divider of the above mentioned type in series with a divider by 2 as an input divider of a programmable counter of the swallower counter type.

According to an advantage of the invention, the out-of-phase outputs of a first divider operating at the fastest frequency are used and not the successive outputs of this divider. Thus, the delay time between two operations occurring at the fastest rate is only the time corresponding to the generation of two out-of-phase outputs of a same counter, delay which can be considered as equal to the switching time of one flip-flop and not three flip-flops as in the prior art where successive countings of a same output of a counter are considered.

BRIEF DESCRIPTION OF THE DRAWINGS

The foregoing and other objects, features and advantages of the invention will be described in more detail in the following description of particular embodiments by referring to the attached drawings in which.

Before describing the invention, a general feature of dividers, a feature which is generally not used and a use of which is a basis of the invention, will be described in relation with FIGS. 2A and 2B.

Figure 2A:
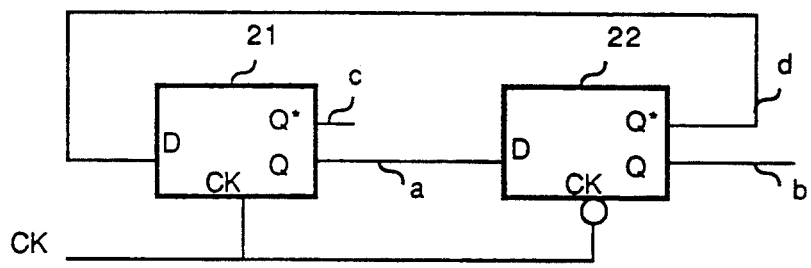
FIGS. 2A and 2B respectively represent a schematic diagram of a divider by 2 and wave-forms appearing at various nodes of this divider.

FIG. 2A represents, as an example, a divider by 2 comprised of two D type flip-flops 21 and 22. Each of these flip-flops comprises an input D, a clock input CK, an output Q, and a complementary output $Q^*$. The output $Q^*$ of flip-flop 22 is connected to the input D of flip-flop 21 and the output Q of flip-flop 21 is applied to the input D of flip-flop 22. A clock signal CK is applied to the input CK of flip-flop 21 and its complementary is applied to the input CK of flip-flop 22. The output signal Q of flip-flop 21 is designated a, the output signal Q of flip-flop 22 is designated b, the output signal $Q^*$ of flip-flop 21 is designated c and the output signal $Q^*$ of flip-flop 22 is designated d.

Figure 2B:
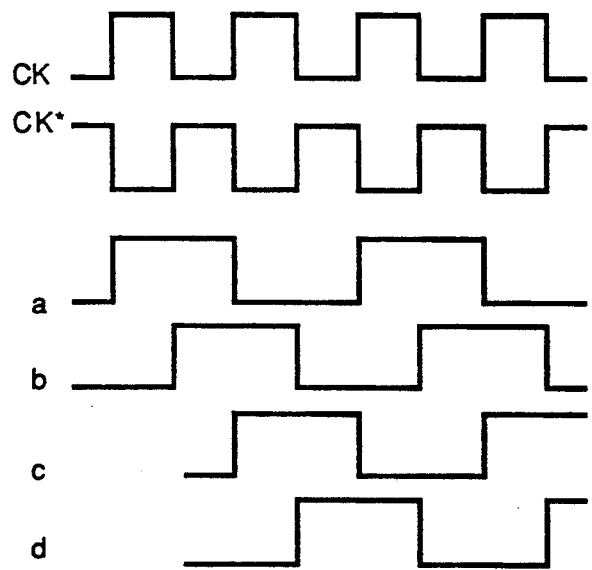

The waveforms of signals CK, $CK^*$, a, b, c and d are shown in FIG. 2B. The signals a, b, c, d all have the same general waveform of a signal at half the clock signal frequency but each of these signals is out of phase to the previous signal of half a clock period.

This is, as it will be noted by those skilled in the art, a general feature of dividers by an integer power of 2 ($2^q$), in which it is possible to find, eventually by adding inverters, $2^{q+1}$ signals of the same frequency, corresponding to the input frequency divided by $2^q$, but out of phase the ones to the others of $360°/2^{q+1}$.

Figure 3:
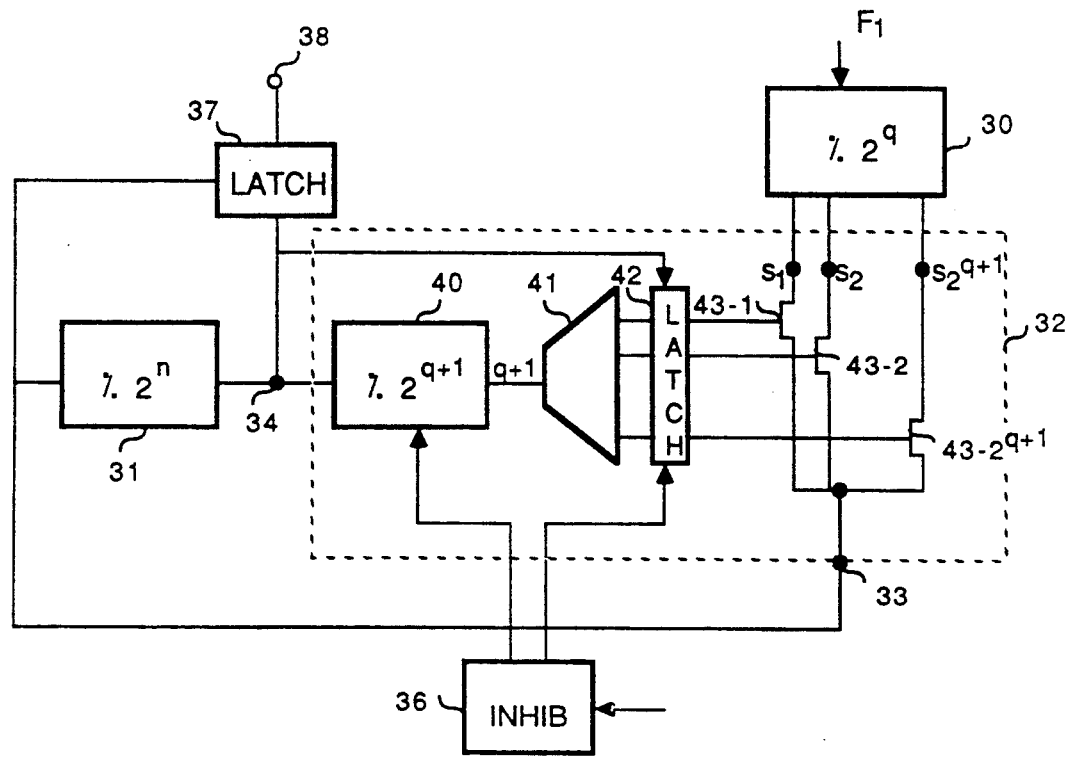
FIG. 3 represents a block diagram of a divider according to the present invention.

This liminary observation being done, an embodiment of the present invention will be now described by referring to FIG. 3.

DESCRIPTION OF THE PREFERRED EMBODIMENTS

FIG. 3 represents a block diagram of a divider according to the invention. This divider essentially comprises a first divider by $2^q$ divider 30, a second divide by $2^n$ divider 31, and a multiplexer 32. The $2^{q+1}$ outputs of divider 30, such as mentioned in relation with FIGS. 2A and 2B, appear at nodes s1, s2, ..., $s2^{q+1}$ and are provided sequentially by the multiplexer 32 at its output 33 which is applied to the input of divider 31.

The output 34 of divider 31 is applied to the control input or sequencing input of multiplexer 32. Thus, if it is considered that the input signal applied to the input of divider 30 is at a frequency F1, a signal at output s1 will be obtained after $2^q$ transitions of a given polarity of signal F1, a signal at the output 34 of divider 31 will then be obtained after $2^{q+n}$ pulses of signal F1. The signal at the output 34 acts up on the multiplexer in such a way that the multiplexer then selects the signal s2 for output and not more signal s1. Signal s2 being delayed of half a period of the signal at frequency F1 with respect to signal s1, a divider by $2^{q+n}+\frac{1}{2}$ is achieved.

It can be considered, as it has been previously explained, that due to the fact that the delay between s1 and s2 depends on one flip-flop, the counter can count at the rate of the switching time of one flip-flop. Another way of considering the speed advantage of the circuit according to the invention consists in saying that, given a circuit that, in the absence of multiplexer 32 enables to have a resolution of one clock period, it is possible, with the same technology, to have a resolution of half a period.

Furthermore, it is clear that if the operation of the multiplexer is interrupted by the action of an inhibition circuit 36, a divide-by-$2^{q+n}$ operation will be achieved instead of a divide-by-$2^{q+n}+\frac{1}{2}$ operation. As a result of the structure of the circuit according to the invention, the switching between one and the other of these division factors is achieved with no loss of information. Indeed, to establish the division factor control signal, the time corresponding to the period of signal F1 multiplied by approximately $2^{q+n}$ is available and not only the half period of signal F1.

FIG. 3 also shows the presence of a latch 37 between the output 34 of divider 31 and the final output 38 of the global divider. This latch 37, as well as divider 31, receives as a clock signal the output 33 of the multiplexer. Latch 37 is used in a conventional way to avoid the provision of erratic signals at the counting transitions.

FIG. 3 furthermore shows a schematic embodiment of multiplexer 32. In this particular embodiment, multiplexer 32 comprises a counter up to $2^{q+1}$ 40 receiving the output 34 of divider 31 and the counting outputs (q+1 outputs) of which are transmitted to a decoder 41 which controls switches 43-1, 43-2, ..., 43-$2^{q+1}$ disposed between each of the outputs s1, s2, ..., $s2^{q+1}$ and the output terminal 33 of the multiplexer. A latch 42 receiving as a clock signal the signal at node 34 is preferably inserted between the decoder and the switches. In the shown embodiment, the switches 43-1, ..., 43-$2^{q+1}$ are represented as MOS transistors. When a divide-by-$2^{q+n}$ operation is desired, the above mentioned inhibition circuit 36 simultaneously inhibits counter 40 and latch 42 so that, when the operation of the inhibition circuit is interrupted, the control will be resumed exactly at the state of the interruption to avoid any phase jump during the transition of a divide-by-$2^{q+n}$ operation to a divide-by-$2^{q+n}+\frac{1}{2}$ operation.

Figure 1:
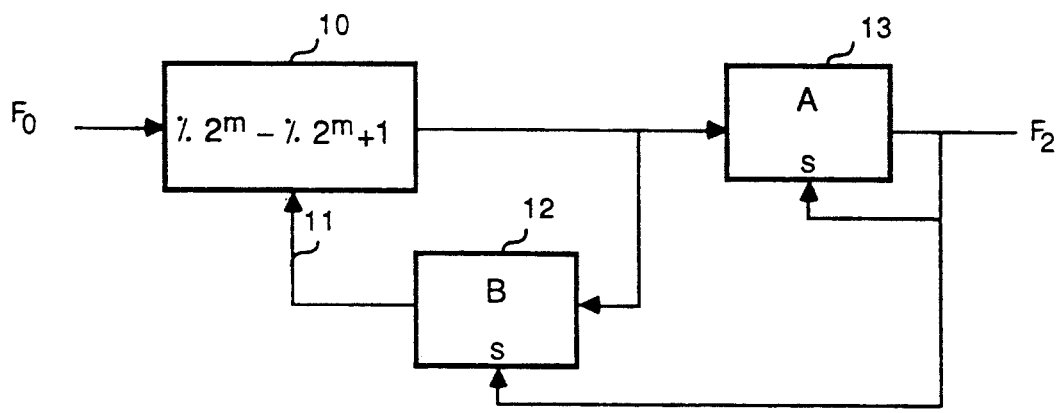
FIG. 1 represents a block diagram of a swallower counter according to the prior art.
Figure 4:
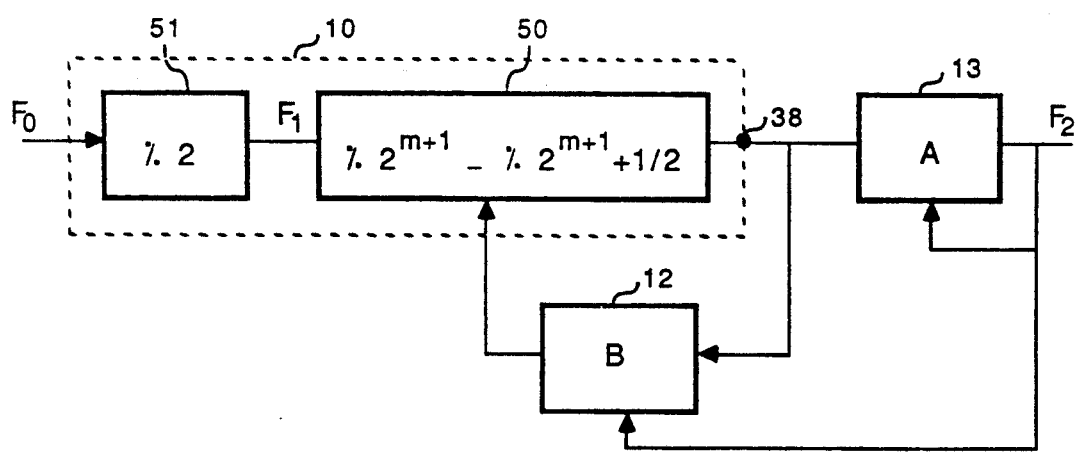
FIG. 4 represents a way to insert a divider according to the invention in a swallower counter.

FIG. 4 schematically represents the insertion of a divider according to the invention to replace the divider 10 of a swallower counter of the type shown in FIG. 1. The counter according to the invention, designated by reference 50, will be chosen so that, with the same notations as those of FIGS. 1 and 3, n+q=m−1 and will be placed in series with a divider by 2 51. Divider 51 receives the frequency F0 mentioned in FIG. 1 and provides the frequency F1 mentioned in FIG. 3. It is the output 38 of divider 50 which is applied to counters 12 and 13 and the output of divider 12 corresponds to the inhibition signal provided by the inhibition circuit 36 of FIG. 3.

The present invention has been schematically described with block diagrams, its different elements being themselves conventional and achievable by those skilled in the art which can furthermore subject these diagrams to various changes and modifications without departing from the scope of the invention. Namely, various means can be used to realize the multiplexer 32 and the circuit according to the invention can be carried out according to various integrated circuit manufacturing technologies, such as bipolar-ECL technology, or MOS technology or mixed MOS/bipolar technology.

We claim:

1. A counter/divider dividing an input frequency (F1) by $2^{q+n}+\frac{1}{2}$, comprising:
   a first divider by $2^q$ receiving the signal to divide of frequency F1 and providing $2^{q+1}$ outputs at the frequency $F1/2^q$ out of phase the ones to the others of $360°/2^{q+1}$;
   a multiplexer having a control terminal and sequentially providing at its output each of said $2^{q+1}$ outputs each time a control signal is applied to said terminal; and
   a second divider by $2^n$ receiving the output of the multiplexer and providing the desired output of the counter/divider, this output being applied to said terminal;
   means to inhibit the operation of the multiplexer whereby a same output of the first divider is permanently provided to the input of the second divider and whereby the division rate of the counter/divider is $2^{q+n}$.

2. A counter/divider as claimed in claim 1, wherein the output of the second divider is provided to the output terminal of the counter/divider through a latch sequenced by the signal applied to the second divider.

3. A counter/divider as claimed in claim 1, wherein the multiplexer comprises a third divider by $2^{q+1}$ all the outputs of which are decoded by a decoder and applied to a latch, the outputs of which sequentially control $2^{q+1}$ switches respectively placed between each of the $2^{q+1}$ outputs of the first divider and the output of the multiplexer.

4. A use of a counter/divider as claimed in claim 1 in series with a divider by 2 as an input divider of a programmable counter of the swallower counter type comprising, as well as this input divider, first and second counters, the output of the first counter forming an inhibition signal modifying the division factor of said counter/divider.

* * * * *